(12) United States Patent
Toda et al.

(10) Patent No.: US 10,209,636 B1
(45) Date of Patent: Feb. 19, 2019

(54) EXPOSURE FOCUS LEVELING METHOD USING REGION-DIFFERENTIATED FOCUS SCAN PATTERNS

(71) Applicant: SANDISK TECHNOLOGIES LLC, Plano, TX (US)

(72) Inventors: Tohru Toda, Yokkaichi (JP); Keisuke Izumi, Yokkaichi (JP); Michiaki Sano, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 15/914,504

(22) Filed: Mar. 7, 2018

(51) Int. Cl.
*G03B 27/52* (2006.01)
*G03F 9/00* (2006.01)
(Continued)

(52) U.S. Cl.
CPC .......... *G03F 9/7034* (2013.01); *G03F 7/2004* (2013.01); *G03F 7/2039* (2013.01);
(Continued)

(58) Field of Classification Search
CPC .... G03F 9/7034; G03F 9/7026; G03F 7/2004; G03F 7/2039; G03F 7/705; G03F 7/70525; G03F 7/70533; G03F 7/70425; G03F 7/70433; G03F 7/70466; G03F 7/70483; G03F 7/70616; G03F 7/70641; G03F 7/70775; H01L 21/0273; H01L 21/0274; H01L 21/67259; H01L 21/76816; H01L 22/12; H01L 22/20; H01L 27/11556; H01L 27/11582; H01L 27/11524;
(Continued)

(56) References Cited

U.S. PATENT DOCUMENTS 5,677,091 A   10/1997   Barr et al.
5,756,238 A    5/1998   Barr et al.
(Continued)

OTHER PUBLICATIONS

Roberts, B. et al., "Aberration Measurement and Matching—A Correlation of Measurement Techniques and Dedication Schemes Implications", Proceedings of SPIE, vol. 5377, Optical Microlithography XVII, pp. 1921-1951, (2004).
(Continued)

*Primary Examiner* — Christina A Riddle
(74) *Attorney, Agent, or Firm* — The Marbury Law Group PLLC

(57) ABSTRACT

Pattern-dependent random deviations in measurement of optimal focus distances can be minimized by separating scan paths into multiple types of scan paths that scan only a respective predetermined image region in semiconductor dies. A substrate including in-process semiconductor dies is coated with a photoresist layer, and is located onto a stage in a lithographic exposure tool. Maps of optimal focus distances are generated by performing optimal focus distance scans that cover a respective subset of image regions having distinct image patterns. The substrate can be leveled with respect to an optics system of the lithographic exposure tool employing a weighted average of multiple maps of optimal focus distances. Once the substrate is leveled on the stage, a lithographic exposure process can be performed with enhanced uniformity in the focus distances across the in-process semiconductor dies.

20 Claims, 13 Drawing Sheets

(51) Int. Cl.
*H01L 21/027* (2006.01)
*H01L 21/768* (2006.01)
*H01L 21/66* (2006.01)
*G03F 7/20* (2006.01)
*H01L 21/67* (2006.01)

(52) U.S. Cl.
CPC .......... *G03F 7/705* (2013.01); *G03F 7/70483* (2013.01); *G03F 7/70525* (2013.01); *G03F 7/70641* (2013.01); *G03F 7/70775* (2013.01); *G03F 9/7026* (2013.01); *H01L 21/0273* (2013.01); *H01L 21/67259* (2013.01); *H01L 21/76816* (2013.01); *H01L 22/12* (2013.01)

(58) Field of Classification Search
CPC ......... H01L 27/11529; H01L 27/11531; H01L 27/11551; H01L 27/11573; H01L 27/11595
USPC .... 355/52, 53, 55, 72, 77; 250/492.1, 492.2, 250/492.22, 493.1; 438/14
See application file for complete search history.

(56) References Cited

U.S. PATENT DOCUMENTS

| | | | |
|---|---|---|---|
| 5,776,645 | A | 7/1998 | Barr et al. |
| 5,915,167 | A | 6/1999 | Leedy |
| 5,936,738 | A | 8/1999 | Liebmann et al. |
| 6,040,909 | A * | 3/2000 | Hasegawa ........... G03F 7/70691 250/548 |
| 6,522,776 | B1 | 2/2003 | Ehrichs |
| 6,586,160 | B2 | 7/2003 | Ho et al. |
| 6,791,082 | B2 | 9/2004 | Komuro et al. |
| 6,791,096 | B2 | 9/2004 | Komuro et al. |
| 6,885,429 | B2 | 4/2005 | Lyons et al. |
| 6,909,930 | B2 | 6/2005 | Shishido et al. |
| 6,917,901 | B2 | 7/2005 | Bowley, Jr. et al. |
| 6,944,578 | B2 | 9/2005 | Bowley, Jr. et al. |
| 7,012,672 | B2 | 3/2006 | Van Rhee et al. |
| 7,081,948 | B2 | 7/2006 | Lyons et al. |
| 7,174,520 | B2 | 2/2007 | White et al. |
| 7,239,371 | B2 * | 7/2007 | Liegl ................... G03F 9/7026 355/53 |
| 7,712,056 | B2 | 5/2010 | White et al. |
| 7,818,710 | B2 | 10/2010 | Wang et al. |
| 7,820,458 | B2 | 10/2010 | Marokkey |
| 8,111,379 | B2 | 2/2012 | Ruan |
| 8,200,468 | B2 | 6/2012 | Ye et al. |
| 8,595,655 | B2 | 11/2013 | Wang et al. |
| 8,828,748 | B2 | 9/2014 | Marokkey |
| 8,947,632 | B2 | 2/2015 | Staals et al. |
| 9,268,151 | B2 | 2/2016 | Debus et al. |
| 9,360,766 | B2 | 6/2016 | Ye et al. |
| 9,454,072 | B2 | 9/2016 | Levinski et al. |
| 9,557,655 | B2 | 1/2017 | Kim et al. |
| 9,651,874 | B2 | 5/2017 | Johnson |
| 2002/0136992 | A1 | 9/2002 | Ho et al. |
| 2003/0015660 | A1 | 1/2003 | Shishido et al. |
| 2003/0038250 | A1 | 2/2003 | Komuro et al. |
| 2003/0106999 | A1 | 6/2003 | Komuro et al. |
| 2003/0158710 | A1 | 8/2003 | Bowley, Jr. et al. |
| 2003/0237064 | A1 * | 12/2003 | White ................ G06F 17/5068 716/136 |
| 2004/0001192 | A1 | 1/2004 | Lyons et al. |
| 2004/0239905 | A1 * | 12/2004 | Van Rhee ......... G03F 7/70508 355/55 |
| 2004/0267506 | A1 | 12/2004 | Bowley, Jr. et al. |
| 2005/0179883 | A1 | 8/2005 | Lyons et al. |
| 2005/0205963 | A1 | 9/2005 | Johnson et al. |
| 2006/0160037 | A1 * | 7/2006 | Brodsky ........... G03F 7/70466 430/396 |
| 2006/0268248 | A1 | 11/2006 | Noelscher |
| 2007/0157139 | A1 | 7/2007 | White et al. |
| 2009/0012769 | A1 | 1/2009 | Wang et al. |
| 2009/0200546 | A1 | 8/2009 | Marokkey |
| 2009/0296057 | A1 | 12/2009 | Ruan |
| 2009/0325087 | A1 * | 12/2009 | Lyons ................... G03B 27/52 430/30 |
| 2010/0112468 | A1 | 5/2010 | Poock et al. |
| 2010/0162197 | A1 | 6/2010 | Ye et al. |
| 2010/0239964 | A1 | 9/2010 | Marokkey |
| 2011/0010677 | A1 | 1/2011 | Wang et al. |
| 2011/0045592 | A1 | 2/2011 | Glass et al. |
| 2011/0045613 | A1 * | 2/2011 | Suzuki ............... G03F 7/70425 438/7 |
| 2011/0164229 | A1 | 7/2011 | Staals et al. |
| 2013/0148203 | A1 | 6/2013 | Debus et al. |
| 2013/0258301 | A1 | 10/2013 | Dehe |
| 2014/0141536 | A1 | 5/2014 | Levinski et al. |
| 2016/0033880 | A1 | 2/2016 | Kim et al. |
| 2016/0161856 | A1 | 6/2016 | Johnson |
| 2016/0246168 | A1 | 8/2016 | Ye et al. |
| 2017/0184979 | A1 | 6/2017 | Hsu et al. |
| 2017/0329235 | A1 | 11/2017 | Hsu et al. |

OTHER PUBLICATIONS

Jekauc, I. et al., "Minimizing Critical Layer Systematic Alignment Errors During Non-Dedicated Processing", Proceedings of SPIE, vol. 5377, Optical Microlithography XVII, pp. 911-919, (2004).

* cited by examiner

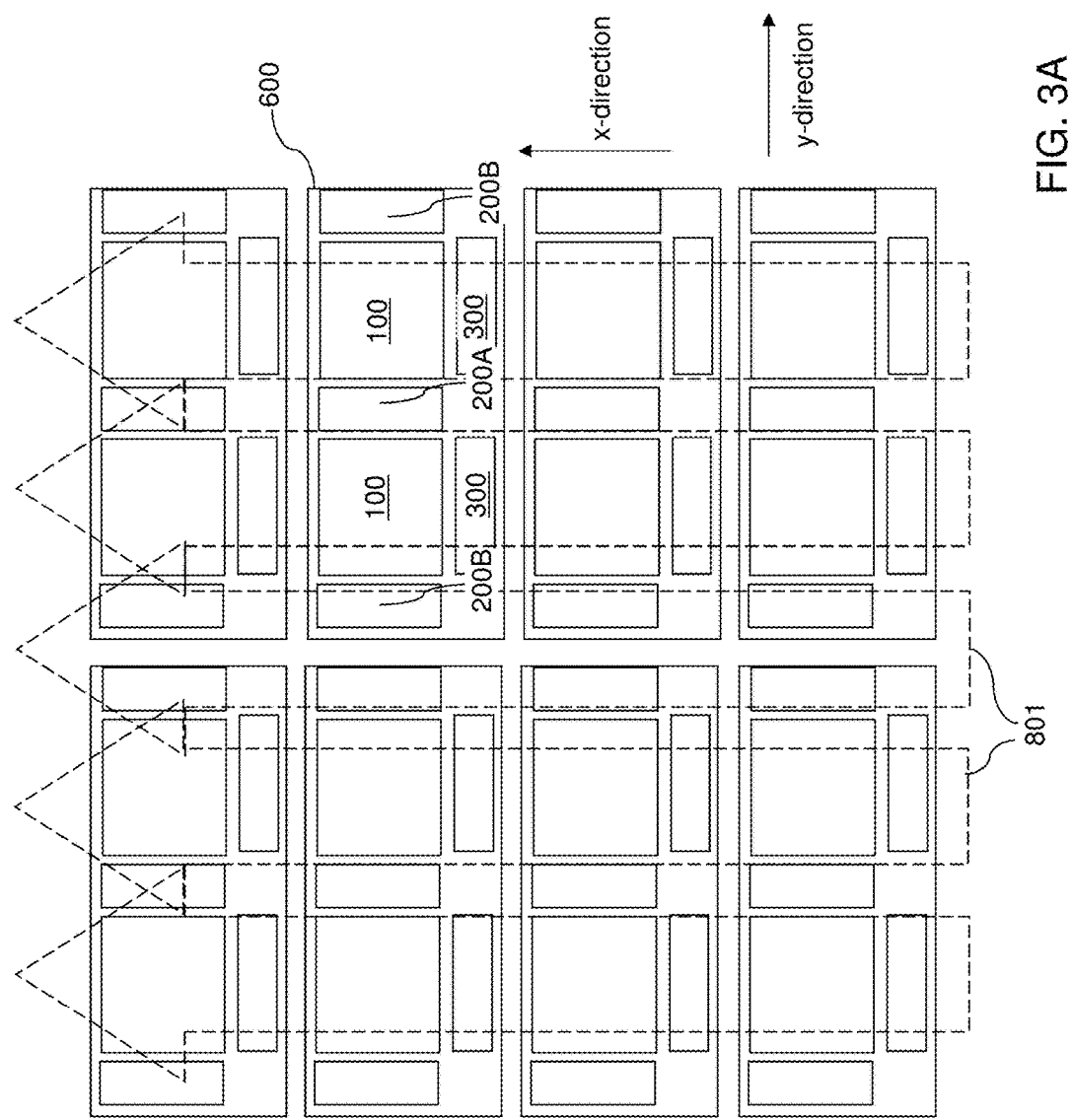

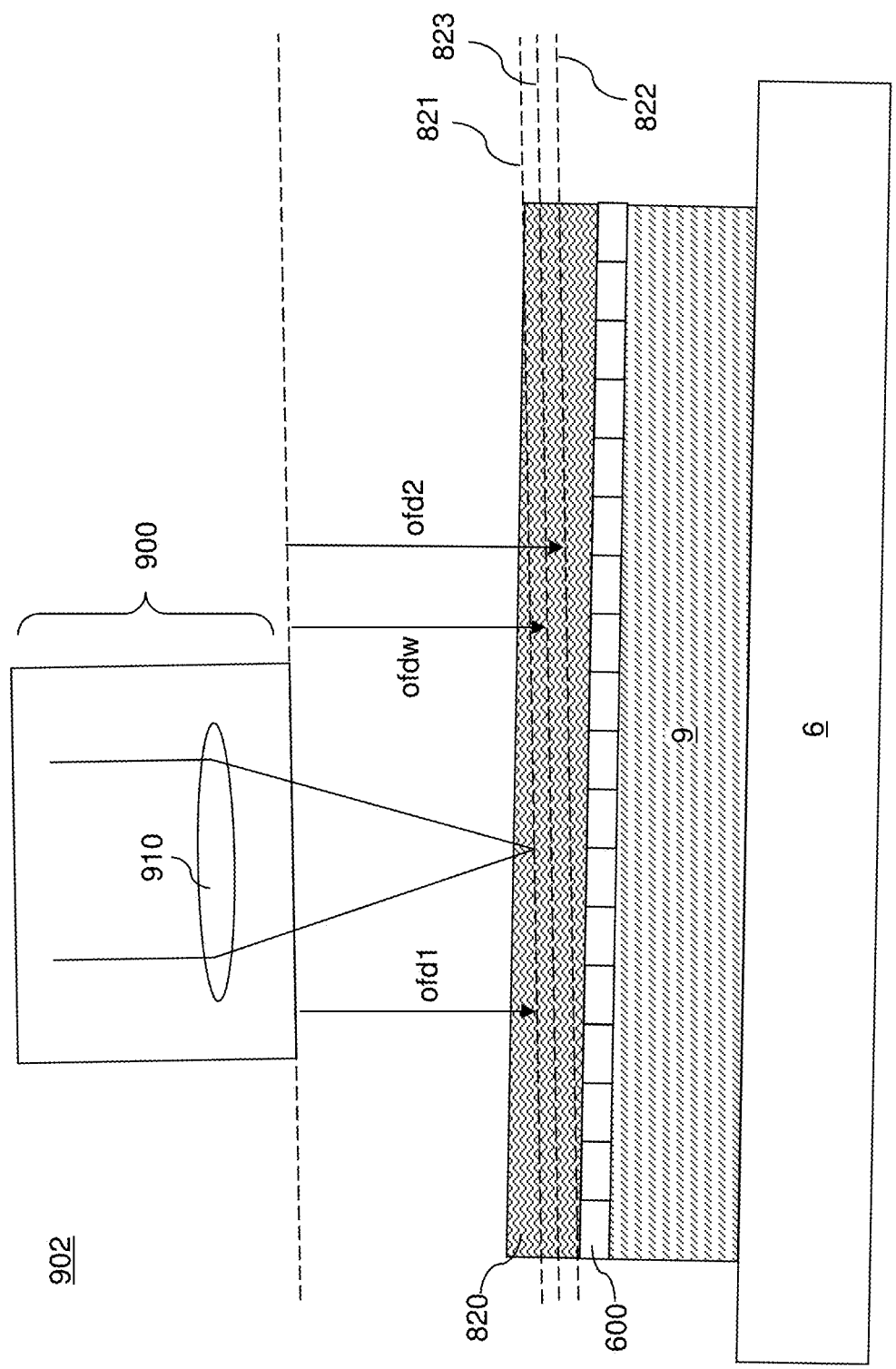

EXPOSURE FOCUS LEVELING METHOD USING REGION-DIFFERENTIATED FOCUS SCAN PATTERNS

FIELD

The present disclosure relates generally to a method of operating a lithographic exposure tool, and particular to a method of leveling a wafer to provide optimal distance of focus across the entire wafer during a subsequent lithographic exposure process.

BACKGROUND

Continued device scaling of semiconductor devices leads to lithographic exposure of photoresist layers at, or near, the highest lithographic resolution that a lithographic exposure tool can provide. The minimum dimensions that are printed employing the highest lithographic resolution are commonly referred to as critical dimensions (CD's). Printing of the critical dimensions on a photoresist layer includes using an optimal focus distance between the optics system of the lithographic exposure tool and the photoresist layer as well as use of an optimal dose, i.e., an optimal amount of exposing (e.g., UV or X-ray) radiation that impinges onto the photoresist layer.

Variation of the focus distance across a wafer coated with a photoresist layer induces degradation of the printed image. To print the critical dimensions on the photoresist layer imposes a small focus budget on the lithographic exposure tool. In other words, small deviations from the optimal focus distance between the optics system of the lithographic exposure tool and the photoresist layer can render a developed pattern in the photoresist layer unusable.

SUMMARY

According to an aspect of the present disclosure, a method of operating a lithographic exposure tool is provided, which comprises: forming semiconductor dies arranged in a plurality of rows and columns in an array on a substrate, wherein the array has a first periodicity along a first horizontal direction and a second periodicity along a second horizontal direction within a horizontal plane that is parallel to a top surface of the substrate, and each semiconductor die includes a first image region and a second image region having a different pattern of structural components than the first image region; applying a photoresist layer over the semiconductor dies; loading the substrate on a stage in a lithographic exposure tool; generating a first map of first optimal focus distances along first scan paths that extend along the first horizontal direction and over the first image regions of the semiconductor dies on the substrate, wherein the first scan paths do not cross any of the second image regions of the semiconductor dies; generating a second map of second optimal focus distances along second scan paths that extend along the first horizontal direction and over the second image regions of the semiconductor dies on the substrate, wherein the second scan paths do not cross any of the first image regions of the semiconductor dies; and leveling the substrate with respect to an optics system of the lithographic exposure tool.

According to an aspect of the present disclosure, a method of operating a lithographic exposure tool comprises forming semiconductor dies arranged in a plurality of rows and columns in an array on a substrate, wherein the array has a first periodicity along a first horizontal direction and a second periodicity along a second horizontal direction within a horizontal plane that is parallel to a top surface of the substrate. Each semiconductor die includes a first image region comprising a NAND memory plane, at least one second image region comprising a NAND word line contact region which comprises a pattern of stepped surfaces of word lines that continuously extend into an area of the first image region along the second horizontal direction, and a third image region which comprises sense amplifier circuitry in a peripheral device region that is electrically connected to bit lines that laterally extend into the area of the first image region along the first horizontal direction. The method further comprises applying a photoresist layer over the semiconductor dies, loading the substrate on a stage in a lithographic exposure tool, generating a first map of first optimal focus distances along first scan paths that extend along the first horizontal direction and over the first and the third image regions of the semiconductor dies on the substrate, wherein the first scan paths do not cross any of the second image regions of the semiconductor dies, generating a second map of second optimal focus distances along second scan paths that extend along the first horizontal direction and over the second image regions of the semiconductor dies on the substrate, wherein the second scan paths do not cross any of the first and third image regions of the semiconductor dies, and leveling the substrate with respect to an optics system of the lithographic exposure tool.

BRIEF DESCRIPTION OF THE DRAWINGS

FIG. 3A is a schematic illustration of a comparative exemplary scan scheme over the first exemplary array of semiconductor dies.

FIG. 8 is a schematic vertical cross-sectional view of an optics system of a lithographic exposure tool and a substrate that illustrates locations of various two-dimensional planes that are generated during substrate leveling according to an embodiment of the present disclosure.

DETAILED DESCRIPTION

Figure 1A:
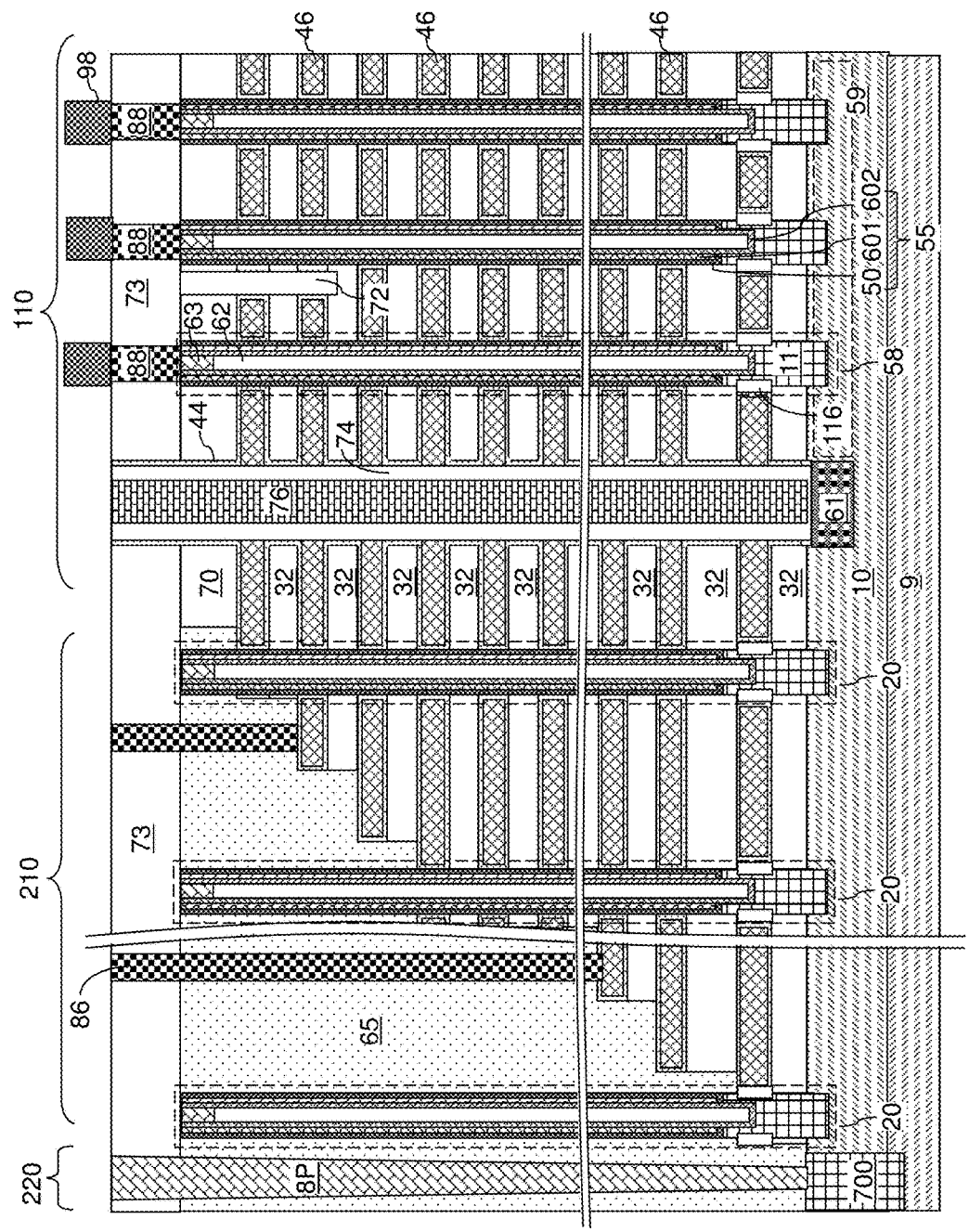
FIG. 1A is a schematic vertical cross-sectional view of an exemplary three-dimensional memory device including a three-dimensional memory array according to an embodiment of the present disclosure.

The across-wafer variations of the focus distance can be reduced employing a leveling system in the lithographic exposure tool. The leveling system can adjust the tilt of a stage holding the wafer along two independent horizontal directions that are normal to the direction separation between the optics system and the wafer. The two independent horizontal directions are commonly referred to as an x-direction and a y-direction. The direction of separation between the wafer and the optics system is commonly referred to as a z-direction.

In order to compensate for non-uniform spacing between the optics system and the top surface of the photoresist layer that is coated on the wafer, a scan is performed across the entire photoresist layer (i.e., across the entire wafer) to generate a map of the distance measurements between the optics system and the photoresist layer.

The embodiments of the present disclosure are directed to providing an improved leveling method between the optics system of the lithographic exposure tool and the photoresist layer so that high quality lithographic patterns can be provided across the entirety of the photoresist layer in all semiconductor chip dies on the wafer by providing multiple types of scan paths such that each type of scan path scans over areas a selected subgroup of pattern regions within the semiconductor dies under scan. The leveling data is generated for each type of scan paths separately, and is combined subsequently to generate leveling correction data.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The same reference numerals refer to the same element or similar element. Unless otherwise indicated, elements having the same reference numerals are presumed to have the same composition. Unless otherwise indicated, a "contact" between elements refers to a direct contact between elements that provides an edge or a surface shared by the elements. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Generally, a semiconductor die, or a semiconductor package, can include a memory chip. Each semiconductor package contains one or more dies (for example one, two, or four). The die is the smallest unit that can independently execute commands or report status. Each die contains one or more planes (typically one to four planes). Identical, concurrent operations can take place on each plane, although with some restrictions. Each plane contains a number of blocks, which are the smallest unit that can be erased by in a single erase operation. Each block contains a number of pages, which is the smallest unit on which a read operation can be performed.

Figure 1B:
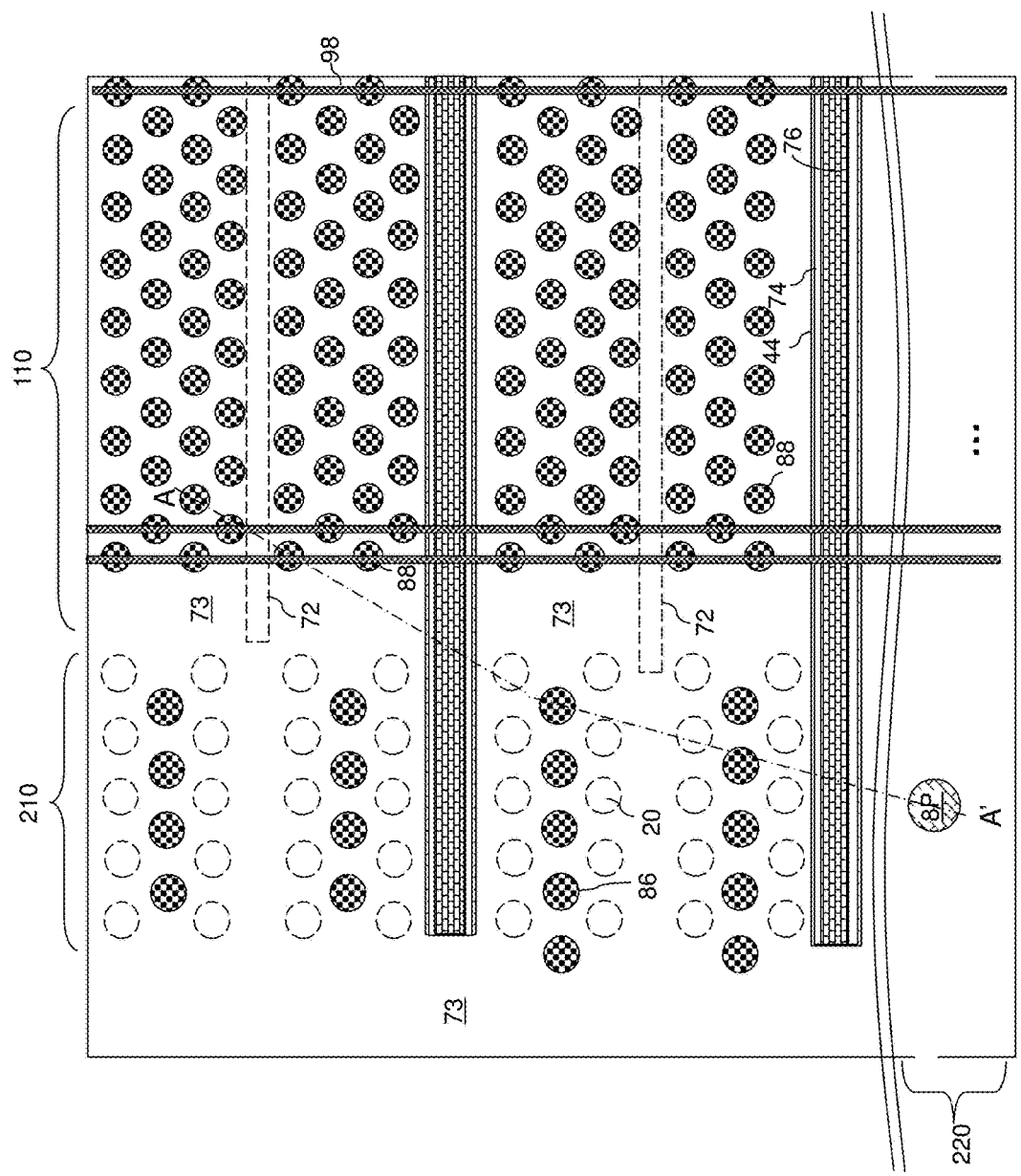
FIG. 1B is a top-down view of the exemplary three-dimensional memory device of FIG. 1A.

A non-limiting example of a three-dimensional memory device that can be included in a semiconductor die is illustrated in FIGS. 1A and 1B. While the three-dimensional memory device illustrated in FIGS. 1A and 1B include vertical NAND memory devices, the memory devices that can be employed for the semiconductor chips employed in the chip assembly structures of the present disclosure include other memory devices such as two-dimensional NAND memory devices, NOR memory devices, SRAM's, DRAM's, ReRAM memory devices, spin torque memory devices, or any other memory device that can be packaged in a semiconductor chip. Further, semiconductor chips including logic devices, such as a processor chip, can be employed for the chip assembly structures of the present disclosure.

The three-dimensional NAND memory device illustrated in FIGS. 1A and 1B includes a substrate (9, 10), which can be a semiconductor substrate. The substrate (9, 10) can include a substrate semiconductor layer 9 such as a semiconductor wafer, for example a silicon wafer, and an optional semiconductor material layer 10 that is formed on the substrate semiconductor layer 9. Semiconductor devices 700 such as field effect transistors can be formed on the semiconductor substrate to provide a peripheral circuit (e.g., driver circuit) for controlling operation of the three-dimensional memory devices provided in the memory array region 110. The peripheral circuit can include a sense amplifier circuitry electrically connected to bit lines 98 that laterally extend into the memory array region 110. The region of the semiconductor devices 700 is referred to as a peripheral device region 220. An alternating stack of insulating layers 32 and spacer material layers are formed over the substrate (9, 10). The spacer material layers are formed as, or are subsequently replaced with, electrically conductive layers 46. An insulating cap layer 70 can be formed over the alternating stack (32, 46). The middle electrically conductive layers 46 comprise word lines/control gate electrodes of the NAND memory devices. At least one upper and lower electrically conductive layer 46 comprises a respective drain and source select gate electrode.

A staircase region can be formed in the contact region 210 by patterning the alternating stack (32, 46) such that underlying layers extend farther than overlying layers. A retro-stepped dielectric material portion 65 can be formed over the stepped surfaces of the alternating stack (32, 46) in the staircase region. Memory openings can be formed in the memory array region 110 and support openings can be formed in the contact region 210 by an anisotropic etch employing an etch mask layer. Memory opening fill structures 58 can be formed in each memory opening, and support pillar structures 20 can be formed in each support opening. The memory opening fill structures 58 and the support pillar structures 20 can include a same set of structural elements have a same composition. For example, each of the memory opening fill structures 58 and the support pillar structures 20 can include a pedestal channel portion 11, a memory stack structure 55, an optional dielectric core 62, and a drain region 63. Each memory stack structure 55 can include a memory film 50 and a semiconductor channel 60. Each memory film 50 can include a layer stack of, from outside to inside, a blocking dielectric layer, a vertical stack of memory elements (which may be embodied, for example, as portions of a charge storage material layer located at levels of the electrically conductive layers 46), and a tunneling dielectric layer. Each semiconductor channel 60 can include a first semiconductor channel layer 601 and a second semiconductor channel layer 602.

A contact level dielectric layer 73 can be formed over the alternating stack (32, 46). If the spacer material layers are provided as sacrificial material layers, backside trenches can be formed between groups of memory opening fill structures 58 to facilitate replacement of the sacrificial material layers with electrically conductive layers 46. Backside recesses can be formed by introducing into the backside trenches an isotropic etchant that etches the material of the sacrificial material layers selective to the insulating layers 32, the memory opening fill structures 58, and the support pillar structures 20. Removal of the sacrificial material layers forms backside recesses that laterally surround the memory opening fill structures 58 and the support pillar structures 20. Tubular insulating spacers 116 can be formed around the pedestal channel portions 11, for example, by oxidation of the semiconductor material of the pedestal channel portions 11. Backside blocking dielectric layers 44 and the electrically conductive layers 46 can be formed in the backside recesses.

Source regions 61 can be formed in the semiconductor material layer 10 underneath the backside trenches, for example, by ion implantation. Surface regions of the semiconductor material layer 10 between the pedestal channel portions 11 and the source regions 61 constitute horizontal semiconductor channels 59. Insulating spacers 74 and backside contact via structures 76 (e.g., source electrode or source local interconnect) can be formed in the backside trenches. Additional contact via structures (88, 86, 8P) can be formed through the contact level dielectric layer 73, and optionally through the retro-stepped dielectric material portion 65. For example, drain contact via structures 88 can be formed through the contact level dielectric layer 73 on each drain region 63. Word line contact via structures 86 can be formed on the electrically conductive layers 46 through the contact level dielectric layer 73 and the retro-stepped dielectric material portion 65 in the contact region 210 (e.g., in the word line electrically hook up region). Peripheral device contact via structures 8P can be formed through the contact level dielectric layer 73 and the retro-stepped dielectric material portion 65 in the peripheral device region 220 directly on respective nodes of the peripheral devices 700. An additional interconnect level dielectric material layer (not shown) and additional metal interconnect structures (not shown) can be formed. The bit lines 98 are located in the additional interconnect level dielectric material layer, extend in the bit line direction (e.g., x-direction) and electrically contact the drain contact via structures 88. The electrically conductive layers (e.g., word lines) 46 extend in the perpendicular word line direction (e.g., y-direction).

Figure 2:
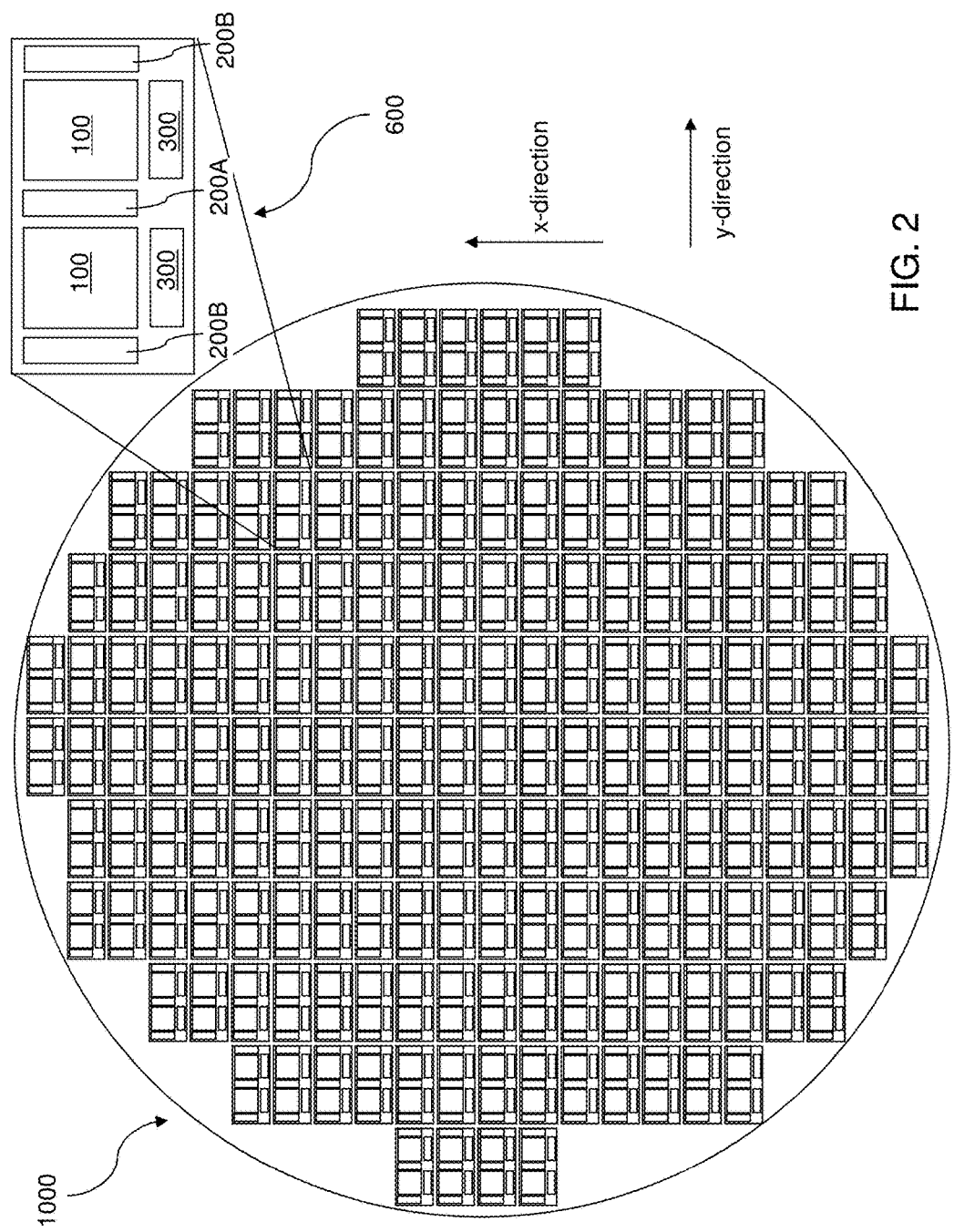
FIG. 2 is a top-down view of a substrate with a first exemplary array of in-process semiconductor dies that can be employed to implement various embodiments of the present disclosure.

Referring to FIG. 2, multiple instances of a semiconductor device, such as multiple instances of the three-dimensional memory device illustrated in FIGS. 1A and 1B, can be embodied within a plurality of semiconductor dies 600 arranged in an array of columns and rows extending along the respective x and y directions. Various processing steps including deposition processes, lithographic patterning processes, and etch processes can be repeatedly performed to form the multiple instances of the three-dimensional memory device of FIGS. 1A and 1B. During each lithographic patterning process, a substrate (e.g., substrate 9 shown in FIGS. 1A and 1B), which can be a semiconductor wafer 1000, such as a silicon wafer, can be loaded onto a lithographic exposure tool including a stepper. The stepper includes a stage on which the semiconductor wafer is mounted. The stepper is configured to provide a two-dimensional horizontal movement of the semiconductor wafer 1000. Once the semiconductor substrate is coated with a photoresist layer and is mounted on the stage, each die area is sequentially placed at an exposure area of the lithographic exposure tool at which lithographic image transfer is performed.

The array of semiconductor dies 600 can have a first periodicity along a first horizontal direction (such as an x-direction) and a second periodicity along a second horizontal direction (such as a y-direction) within a horizontal plane that is parallel to a top surface of the semiconductor wafer 1000. In other words, the first periodicity can be a minimum separation distance between identical patterns along the x-direction, and the second periodicity can be a minimum separation distance between identical patterns along the y-direction.

In one embodiment, each semiconductor die 600 can include at least one first image region 100 and at least one second image region (200A, 200B) having different pattern of structural components than the at least one first image region 100. In one embodiment, each semiconductor die 600 can include multiple first image regions 100 that are laterally spaced among one another by multiple second image regions (200A, 200B). In the illustrated example of FIG. 2, a semiconductor die 600 can include two first image regions 100, an inner second image region 200A located between the two first image regions 100, two outer second image regions 200B located outside of the two first image regions 100, and two third image regions 300. The inner second image region 200A and the outer second image regions 200B can include the same device pattern.

In one embodiment, each first image region 100 can include an instance of the memory array region 110 illustrated in FIGS. 1A and 1B, each second image region (200A, 200B) can include an instance of the contact region 210, and each third image region 300 can include an instance of the peripheral device region 220 illustrated in FIGS. 1A and 1B. Thus, each first image region 100 can include one memory plane containing a two-dimensional array of memory stack structures 55 or in-process structures for forming the memory stack structures, and each second image region (200A, 200B) can include stepped surfaces (e.g., word line staircase) of an alternating stack (32, 46), contact via cavities, or contact via structures 86 depending on the processing step at which the semiconductor wafer 1000 is located into the lithographic exposure tool. Word line decoding semiconductor devices, commonly referred to as row decoders, can be formed in the second image regions (200A, 200B). In this case, each third image region 300 can include peripheral devices 700 and metal interconnect structures for forming sense amplifiers and connections to bit lines 98 that extend to the memory array regions 110, i.e., into the first image regions 100.

The substrate, such as the semiconductor wafer 1000, should be leveled prior to lithographic exposure of the photoresist layer on the semiconductor wafer 1000. The stepper moves the stage and the semiconductor wafer 1000 through all locations of the semiconductor dies 600 to determine focus differences for the semiconductor wafer 1000 as initially mounted.

Figure 3B:
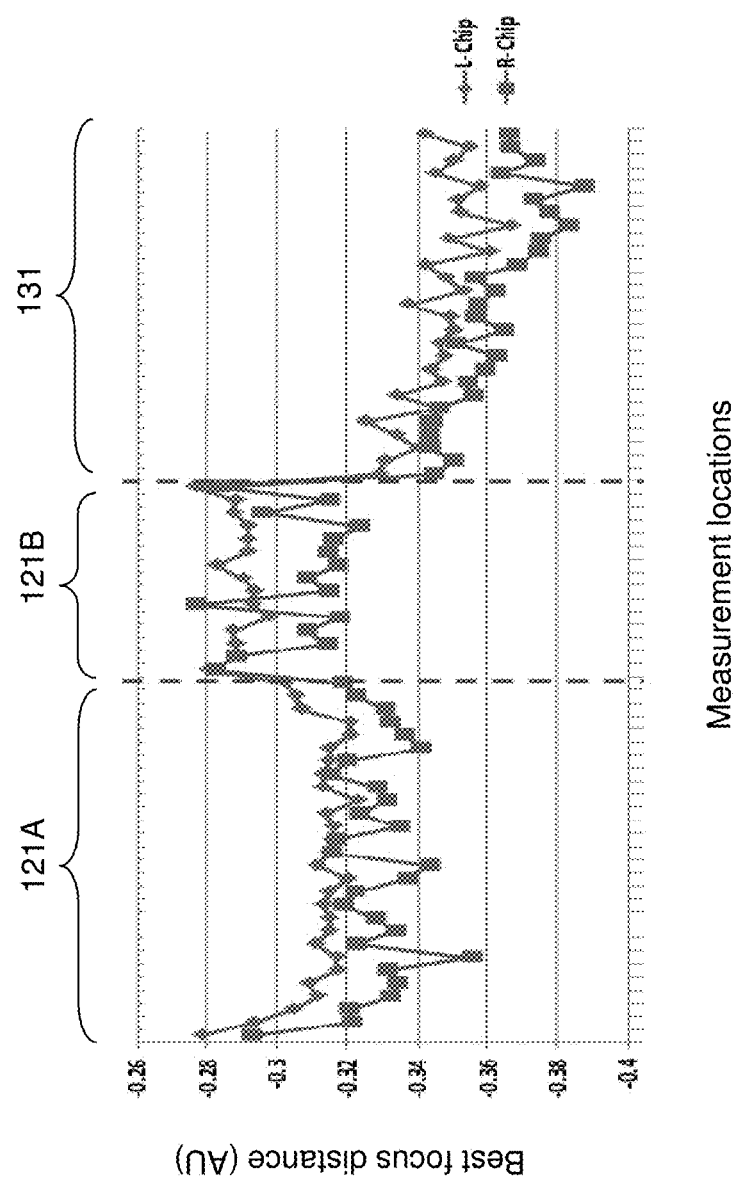
FIG. 3B illustrates exemplary measurement data for best focus distances obtained employing the comparative exemplary scan scheme of FIG. 3A.

Referring to FIG. 3A, a comparative exemplary scan scheme is illustrated, which can be employed to perform a focus scan path 801 over the first exemplary array of semiconductor dies 600. Each focus scan path can traverse a column of dies 600 extending along the x-direction. The area of the focus scan can be less than the width of each semiconductor die 600 along the direction that is perpendicular to the scan direction, i.e., the width along the y-direction. In this case, the area covered by each scan path of the focus scan can be randomly selected, or can be selected to encompass first image regions 100 or neighboring pairs of second image regions (200A, 200B).

Best focus distances can be measured by vertically moving the stage of the stepper in the lithographic tool, and by analyzing optical images of the photoresist layer employing an automated image analysis program and determining a vertical distance between an optics system of the lithographic tool and the top surface of the photoresist layer on the semiconductor wafer 1000.

Measured best focus distances can be obtained from focus scans employing the comparative exemplary scan scheme. In one embodiment, the best focus distances can be measured prior to lithographically exposing a photoresist layer for patterning contact via cavities (that can be employed to form contact via structures 86). A set of data from such a measurement is plotted in FIG. 3B. Focus scans that scan primarily over the inner second image regions 200A in combination with neighboring image regions provide a first set 121A of measured best focus distances. Focus scans that scan primarily over the outer second image regions 200B in combination with neighboring image regions provide a second set 121B of measured best focus distances. Focus scans that scan primarily over the third image regions 300 and the first image regions 100 in combination with neighboring image regions provide a third set 131 of measured best focus distances. Data labeled "L-chip" is from focus scans that traverse a left-side of the semiconductor die 600, and data labeled "R-chip" is from focus scans that traverse a right-side of the semiconductor die 600. As the data demonstrates, focus scans that measure best focus distances from multiple image regions generate best focus distances that vary among primarily scanned image regions. It is believed that different image patterns in different image regions generate different best focus distances, and random inclusion or exclusion of peripheral image regions causes a large scatter among the best focus distances.

Figure 4A:
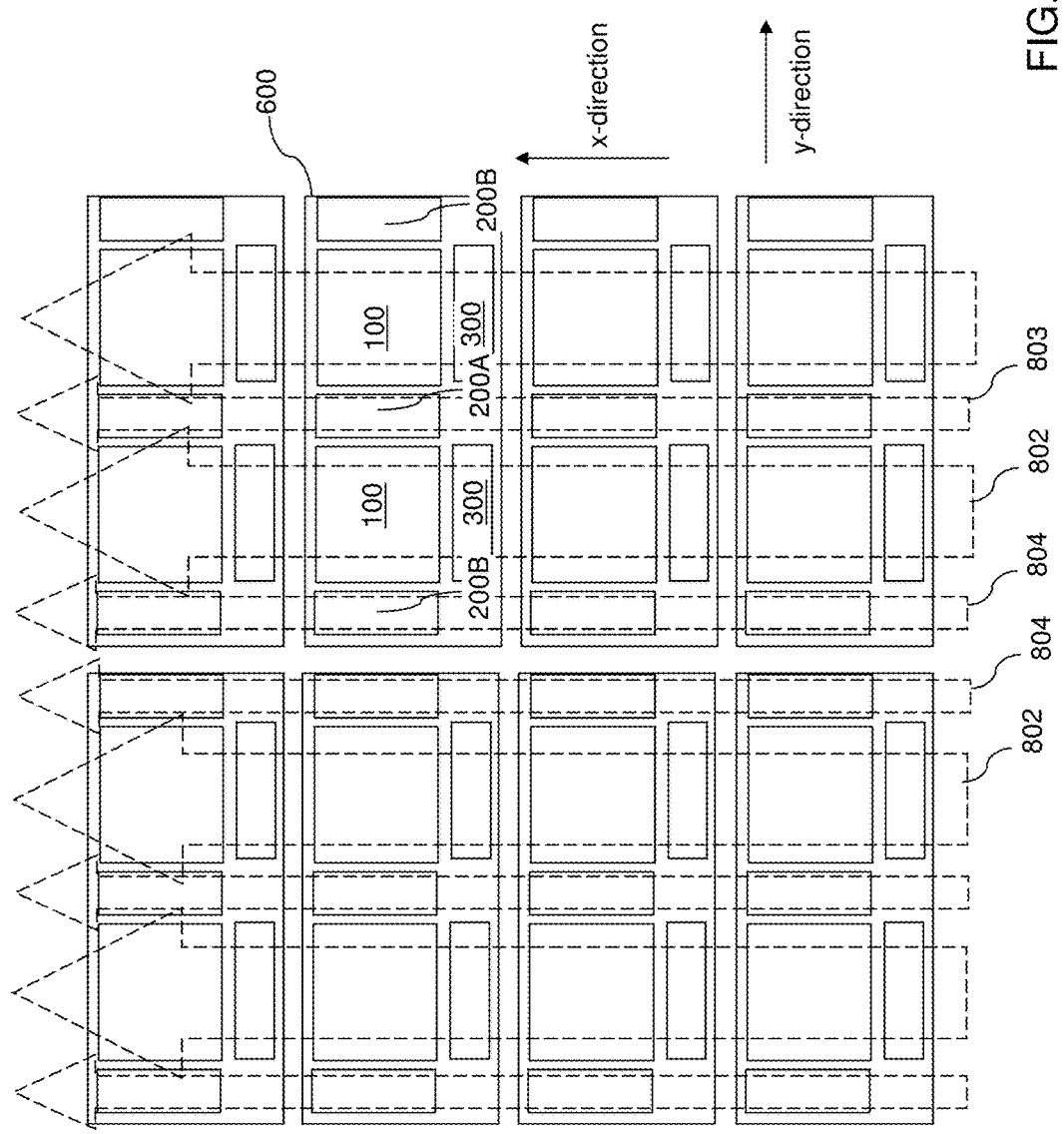
FIG. 4A is a schematic illustration of an exemplary scan scheme over the first exemplary array of semiconductor dies according to an embodiment of the present disclosure.

Referring to FIG. 4A, an exemplary scan scheme according to an embodiment of the present disclosure is illustrated, which can be employed to perform a focus scan over the first exemplary array of semiconductor dies 600. Each focus scan path can traverse a column of dies 600 extending along the x-direction. The scan area of each focus can be limited to include only first image regions 100 and third image regions 300 without including the second image regions 200, as shown by paths 802, or only second image regions 200 without including the first image regions 100 or the third image regions 300, as shown by paths 803 and 804 in FIG. 4A. The area of the focus scan can be less than the width of each first image region 100 along the y-direction (i.e., the direction that is perpendicular to the scan direction), or can be less than the width of each second image region 200 along the y-direction. In this case, the area covered by each scan path of the focus scan is selected to include only image regions of a preselected type while excluding at least one image region of an unselected type.

Measured best focus distances can be obtained from focus scans employing the comparative exemplary scan scheme. In one embodiment, the best focus distances can be measured prior to lithographically exposing a photoresist layer for patterning contact via cavities (that can be employed to form contact via structures 86). A set of data from such a measurement employing the scan paths of an embodiment of the present disclosure is plotted in FIG. 4B. Focus scan paths 803 that scan the inner second image regions 200A between adjacent first image regions (e.g., between adjacent memory planes) 100 in the same semiconductor die 600 without scanning neighboring image regions provide a first set 221A of measured best focus distances. Focus scan paths 804 that scan over the outer second image regions 200B (e.g., edge regions that are not located between adjacent memory planes in one semiconductor die) without scanning neighboring image regions provide a second set 221B of measured best focus distances. Focus scan paths 802 that scan over the third image regions 300 and the first image regions 100 without scanning the second image regions (200A, 200B) provide a third set 231 of measured best focus distances. Data labeled "L-chip" is from focus scans that traverse a left-side of the semiconductor die 600, and data labeled "R-chip" is from focus scans that traverse a right-side of the semiconductor die 600. As the data demonstrates, focus scans that measure best focus distances from preselected types of image regions generate best focus distances with lesser variation in the measured best focus distances.

Figure 5:
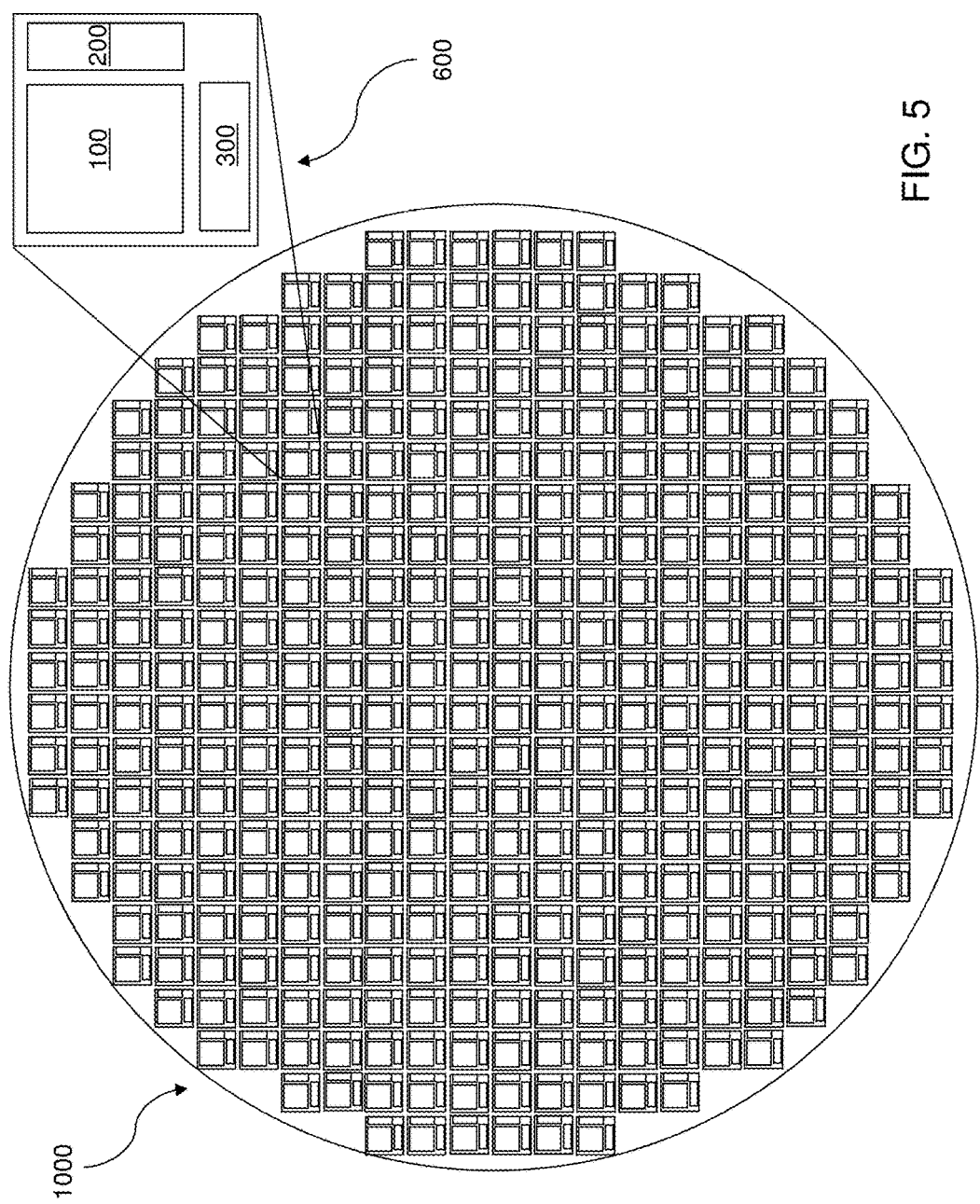
FIG. 5 is a top-down view of a substrate with a second exemplary array of in-process semiconductor dies that can be employed to implement various embodiments.

It is to be understood that the methods according to embodiments of the present disclosure can be applied to semiconductor dies 600 having different layouts for image regions. Referring to FIG. 5, a semiconductor wafer 1000 including a second exemplary array of in-process semiconductor dies 600 is illustrated, which can be employed to implement embodiments of the present disclosure. Each semiconductor die 600 in the second exemplary array can include a first image region 100, a second image region 200, and a third image region 300. The first image region 100 can include a memory array region 110, the second image region 200 can include a contact region 210 and a row decoder circuitry, and the third image region 300 can include a sense amplifier circuitry in the peripheral device region 220 electrically connected to bit lines 98 that laterally extend into the memory array region 110.

Figure 6:
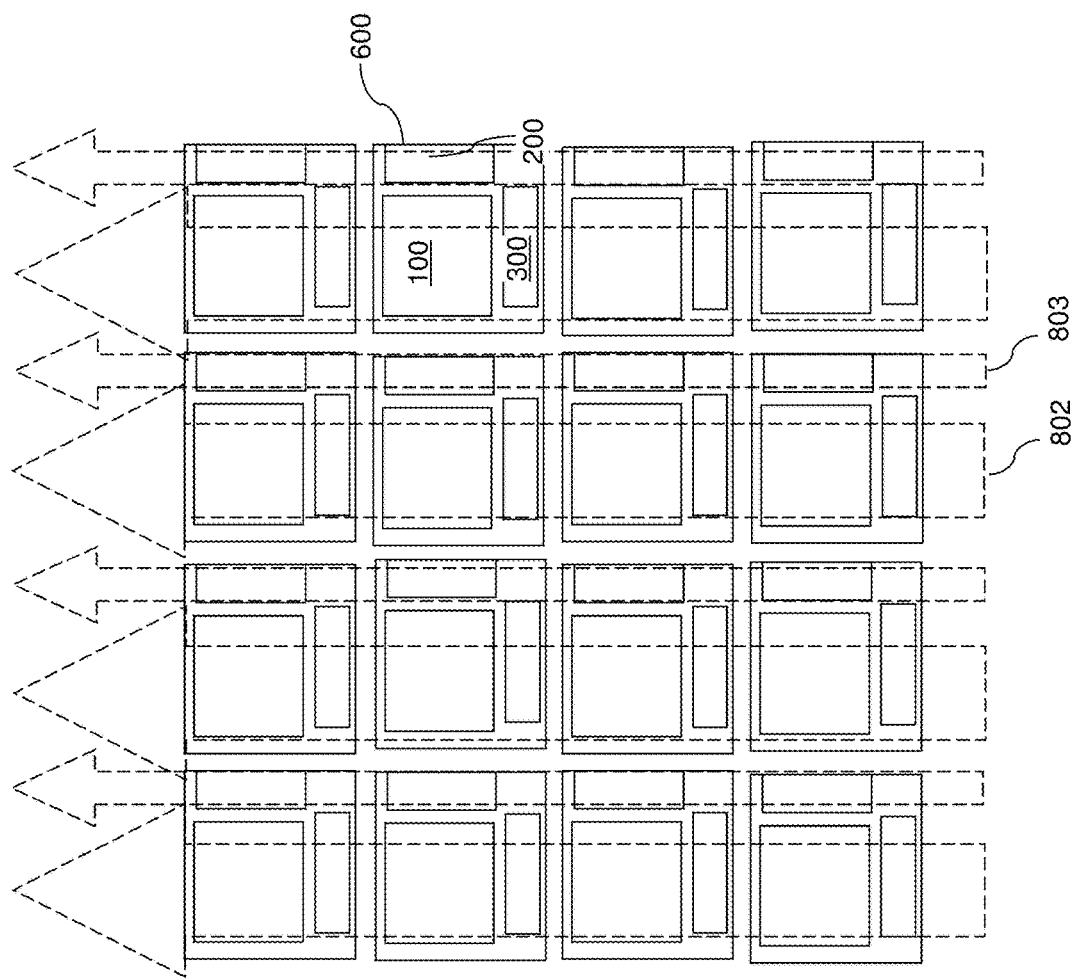
FIG. 6 is a schematic illustration of an exemplary scan scheme over the second array of semiconductor dies according to an embodiment of the present disclosure.

Referring to FIG. 6, an exemplary scan scheme according to an embodiment of the present disclosure is illustrated, which can be employed to perform a focus scan over the second exemplary array of semiconductor dies 600 illustrated in FIG. 5. Each focus scan path can traverse a column of dies 600 extending along the x-direction. The scan area path 802 of each focus can be limited to include only first image regions 100 and third image regions 300 without including the second image regions 200. The scan area path 803 of each focus can be limited to include only the second image regions 200 without including the first image regions 100 or the third image regions 300. The area of the focus scan can be less than the width of each first image region 100 along the y-direction (i.e., the horizontal direction that is perpendicular to the scan direction), or can be less than the width of each second image region 200 along the y-direction. In this case, the area covered by each scan path (802, 803) of the focus scan is selected to include only image regions of a preselected type while excluding at least one image region of an unselected type.

Figure 7:
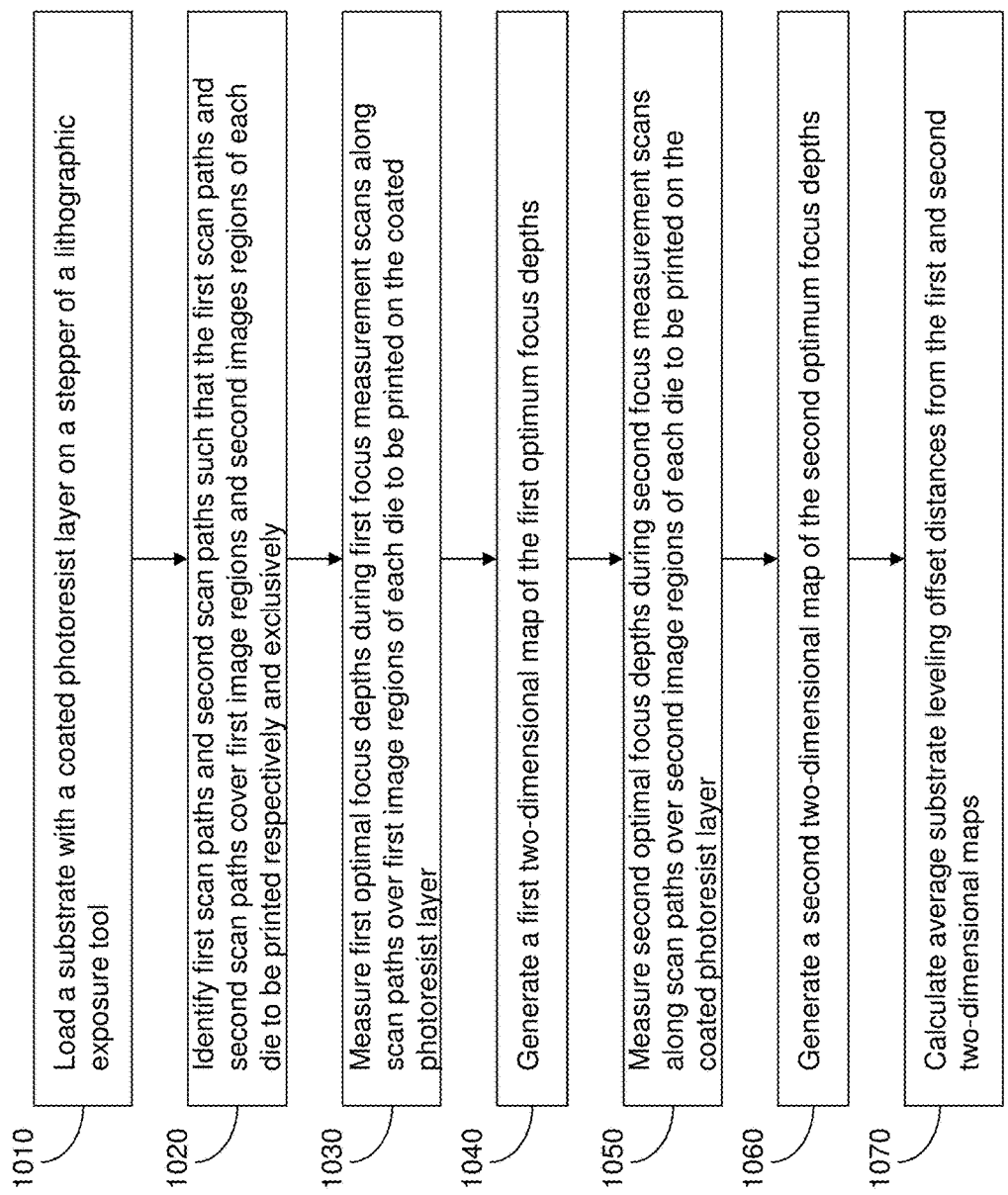
FIG. 7 is a flow chart illustrating a sequence of processing steps that can be employed according to embodiments of the present disclosure.

Referring to FIG. 7, a sequence of processing steps is illustrated, which can be employed to level a semiconductor wafer prior to lithographic exposure of a photoresist layer to form lithographic patterns on a array of semiconductor dies 600.

Referring to step 1010, a photoresist layer can be applied to a substrate, such as a semiconductor wafer 1000, that includes semiconductor dies 600. The semiconductor wafer 1000 can be at any processing step after formation of distinct patterns in the image regions of each semiconductor die 600. In other words, the various image regions are optically distinct among one another due to preexisting patterns therein. The substrate with the coated photoresist layer can be loaded on a stage 6 of a stepper of a lithographic exposure tool, as shown in FIG. 8.

Referring to step 1020, first scan paths and second scan paths are identified such that the first scan paths 802 and second scan paths {803 or (803, 804)} cover first and third image regions (100, 300) and second images regions 200 of each semiconductor die 600 to be printed respectively and exclusively. In other words, the first scan paths 802 cover the first and third image regions (100, 300), and do not cover the second image regions 200, and the second scan paths {803 or (803, 804)} cover the second image regions 200 and do not cover the first and third image regions (100, 300). The first image regions 100 and the second image regions 200 have different underlying patterned structures.

Referring to step 1030, first focus measurement scans are performed along the first scan paths 802 (i.e., over portions of the coated photoresist layer that overlie the first image regions 100 of each semiconductor die 600). The first focus measurement scans measure optimal focus depths, which are herein referred first measured optimal focus depths.

Referring to step 1040, a first two-dimensional map of the first optimum focus depths is generated. The first two-dimensional map is generated along first scan paths that extend along a first horizontal direction (such as the x-direction) and over the first image regions 100 of the semiconductor dies 600 on the semiconductor wafer 1000. The first scan paths 802 do not cross any of the second image regions 200 of the semiconductor dies 600.

Referring to step 1050, second focus measurement scans are performed along the second scan paths {803 or (803, 804)} (i.e., over portions of the coated photoresist layer that overlie the second image regions 200 of each semiconductor die 600). The second focus measurement scans measure optimal focus depths, which are herein referred second measured optimal focus depths.

Referring to step 1060, a second two-dimensional map of the second optimum focus depths is generated. The second two-dimensional map is generated along second scan paths {803 or (803, 804)} that extend along the first horizontal direction and over the second image regions 200 of the semiconductor dies 600 on the semiconductor wafer 1000. The second scan paths do not cross any of the first image regions 100 of the semiconductor dies 600.

Referring to step 1070, the semiconductor substrate can be leveled with respect to an optics system of the lithographic exposure tool employing a weighted average of the first map of first optimal focus depths and the second map of second optimal focus depths. The leveling of the semiconductor substrate may be effected employing any of the various methods to be described below.

Referring to FIG. 8, an optics system 900 of a lithographic exposure tool 902 and a substrate 9 (such as the semiconductor wafer 1000) are illustrated. The substrate 9 is mounted on a stage 6 of the lithographic tool 902. Semiconductor dies 600 are present on the substrate 9. A photoresist layer 820 is coated on the top surfaces of the semiconductor dies 600. The optics system 900 includes at least one lens 910 that defines the focal plane of the images to be subsequently printed on the photoresist layer 820 during subsequent lithographic exposure. In one embodiment, the lithographic exposure tool 902 is a deep ultraviolet lithographic exposure tool, a mid-ultraviolet lithographic exposure tool, or an X-ray lithographic exposure tool.

In one embodiment, a first two-dimensional plane 821 that provides a least root mean square distance deviation for the first map of first optimal focus depths ofd1 can be generated employing an automated program provided with a control system of the lithographic exposure tool. In addition, a second two-dimensional plane 822 that provides a least root mean square distance deviation for the second map of second optimal focus depths ofd2 can be generated employing the automated program. The leveling of the substrate 9 can be performed employing the location of the first two-dimensional plane 821 and the second two-dimensional plane 822 with respect to the optics system 900.

In one embodiment, the automated program can determine a weighted two-dimensional plane 823 within respective to the optics system 920 by calculating a weighted average of the first two-dimensional plane 821 and the second two-dimensional plane 822. A computer configured to control the operation of the stepper of the lithographic exposure tool can be loaded with the automated program to determine the locations of the various two-dimensional planes (821, 822, 823). Leveling the substrate 9 can be performed to place a target focal plane within the photoresist layer 820 on the substrate 9 entirely within the weighted two-dimensional plane 823 having weighted optimal focus depths labeled "ofdw".

In one embodiment, the target focal plane within the photoresist layer 820 can be a two-dimensional plane that is parallel to a top surface of the photoresist layer 820 and located between a bottom surface of the photoresist layer 820 and the top surface of the photoresist layer 820 (at the bottom surface of the photoresist layer 820, or at the top surface of the photoresist layer 820).

In one embodiment, weighting factors multiplied to the first or second two-dimensional plane (821, 822), respectively, for calculation of the weighted two-dimensional plane 823 are not proportional to a respective fraction of scanned areas in the first scan paths or the second scan paths with respect to total scanned areas of the semiconductor dies 600. In other words, in case the first scanned areas include 70% of the total scanned areas of the semiconductor dies 600 and the second scanned areas include 30% of the total scanned areas of the semiconductor dies 600, the weight multiplied to the first two-dimensional plane 821 may not be 0.7 and the weight multiplied to the second two-dimensional plane 822 may not be 0.3. Instead, the weights to be multiplied can be proportional to the total number of via cavities or line structures to be subsequently formed in the first image regions 100 or in the second image regions 200 in a subsequent lithographic exposure process.

The semiconductor dies 600 can be lithographically exposed after leveling the substrate with a via pattern. In one embodiment, more via patterns are formed in the second image region 200 of each semiconductor die 600 than in the first image region 100 of each semiconductor die 600. A first weighting factor multiplied to the first two-dimensional plane 821 for calculation of the weighted two-dimensional plane 823 is less than a second weighting factor multiplied to the second two-dimensional plane 822 for calculation of the weighted two-dimensional plane 823. The first weighting factor and the second weighting factor are positive and add up to 1.0.

Figure 9A:
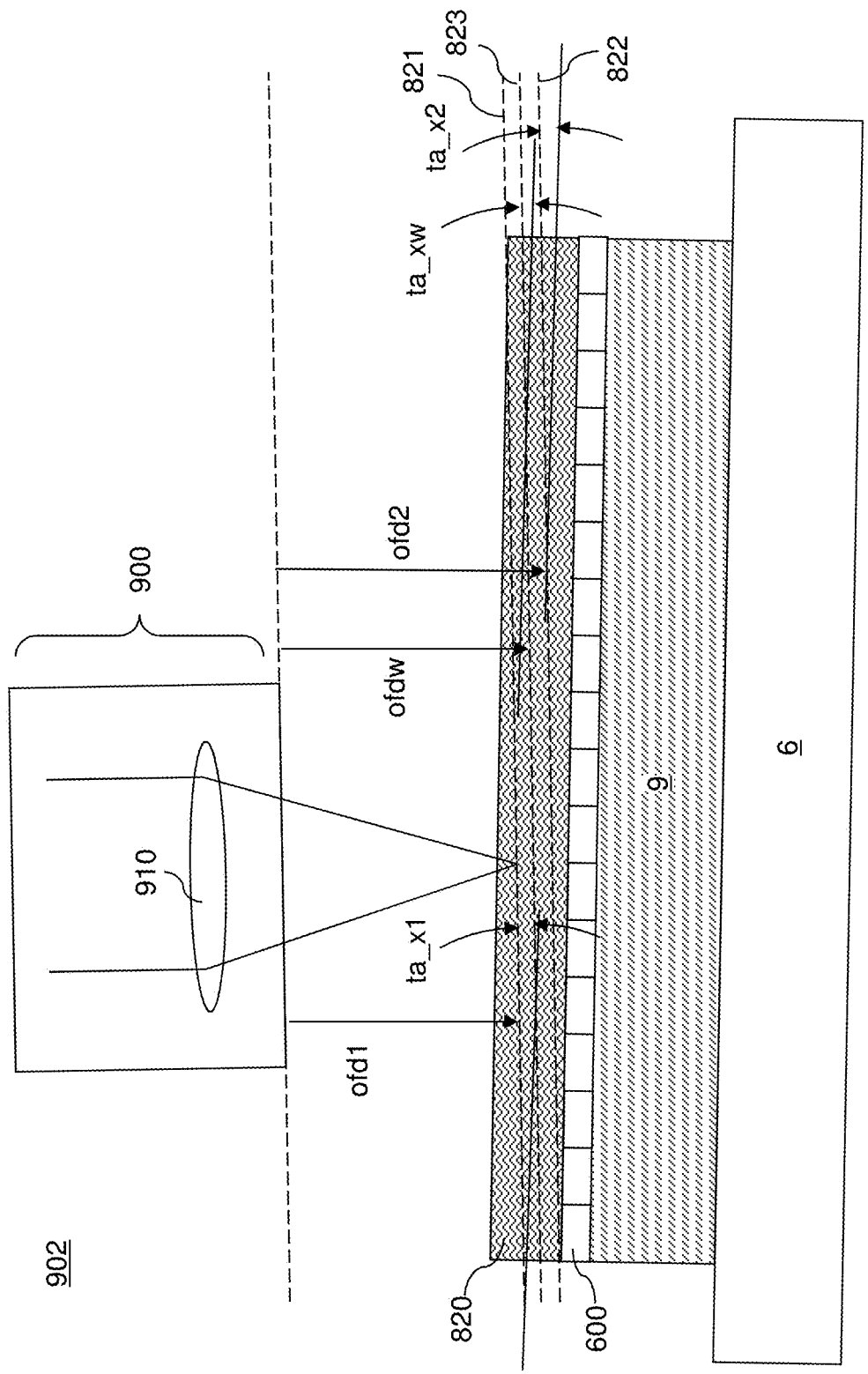
FIG. 9A is a schematic vertical cross-sectional view of an optics system of a lithographic exposure tool and a substrate that illustrates various x-axis tilt angles that are generated during substrate leveling according to an embodiment of the present disclosure.
Figure 9B:
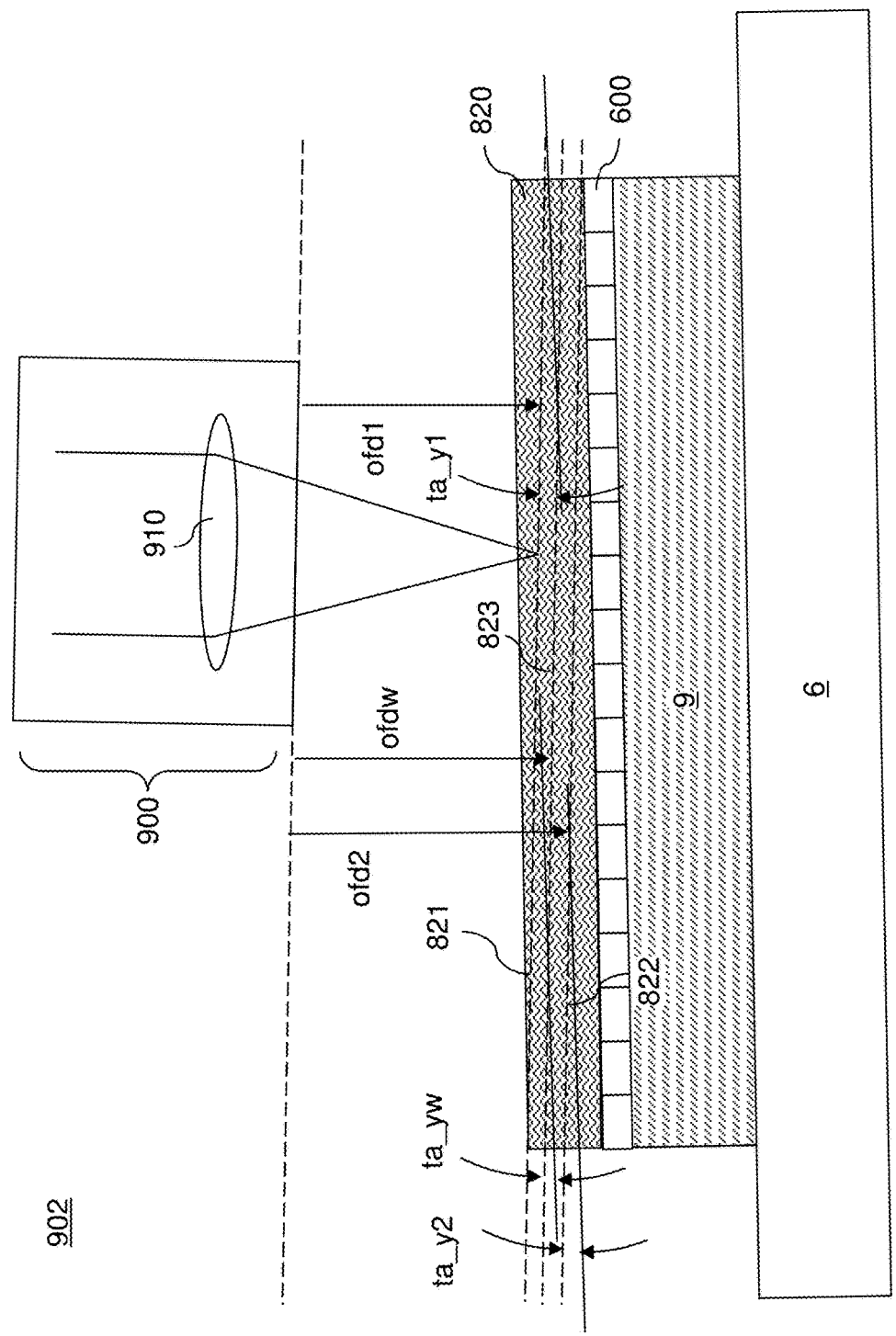
FIG. 9B is a schematic vertical cross-sectional view of an optics system of a lithographic exposure tool and a substrate that illustrates various y-axis tilt angles that are generated during substrate leveling according to an embodiment of the present disclosure.

Referring to FIGS. 9A and 9B, an optics system 900 of a lithographic exposure tool and a substrate 9 are illustrated. FIG. 9A is a vertical cross-sectional view along a vertical plane that is perpendicular to the x-direction, and FIG. 9B is a vertical cross-sectional view along a vertical plane that is perpendicular to the y-direction.

In one embodiment, an x-direction tilt angle ta_x1 and a y-axis tilt angle ta_y1 can be determined for the first two-dimensional plane 821. An x-direction tilt angle ta_x2 and a y-axis tilt angle ta_y2 can be determined for the second two-dimensional plane 822. The leveling of the substrate 9 can be performed employing the x-direction tilt angles (ta_x1, ta_x2) and the y-direction tilt angles (ta_y1, ta_y2).

In one embodiment, a weighted x-direction tilt angle ta_xw within respective to the optics system 900 can be determined by calculating a weighted average of the x-direction tilt angle ta_x1 of the first two-dimensional plane 821 and the x-direction tilt angle ta_x2 of the second two-dimensional plane 822. A weighted y-direction tilt angle ta_yw within respective to the optics system 900 can be determined by calculating a weighted average of the y-direction tilt angle ta_y1 of the first two-dimensional plane 821 and the y-direction tilt angle ta_y2 of the second two-dimensional plane 822. In one embodiment, leveling the substrate 9 can be performed by tilting the substrate 9 with the weighted x-direction tilt angle ta_xw within a vertical plane including the x-direction and with the weighted y-direction tilt angle ta_yw within a vertical plane including the y-direction.

In one embodiment, weighting factors multiplied to the x-direction tilt angle (ta_x1, ta_x2) and the y-direction tilt angle (ta_y1, ta_y2) of the first or second two-dimensional planes (821, 822) are not proportional to a respective fraction of scanned areas in the first scan paths or the second scan paths with respect to total scanned areas of the semiconductor dies 600. In other words, in case the first scanned areas include 70% of the total scanned areas of the semiconductor dies 600 and the second scanned areas include 30% of the total scanned areas of the semiconductor dies 600, the weight multiplied to the first two-dimensional plane 821 may not be 0.7 and the weight multiplied to the second two-dimensional plane 822 may not be 0.3. Instead, the weights to be multiplied can be proportional to the total number of via cavities or line structures to be subsequently formed in the first image regions 100 or in the second image regions 200 in a subsequent lithographic exposure process.

In one embodiment, the semiconductor dies 600 can be lithographically exposed after leveling the substrate 9 with a via pattern. In one embodiment, more via patterns are formed in the second image region 200 of each semiconductor die 600 than in the first image region 100 of each semiconductor die 600. A first weighting factor multiplied to the x-direction tilt angle ta_x1 and the y-direction tilt angle ta_y1 of the first two-dimensional plane 821 is less than a second weighting factor multiplied to the x-direction tilt angle ta_x2 and the y-direction tilt angle ta_y2 of the second two-dimensional plane 822. The first weighting factor and the second weighting factor are positive and add up to 1.0.

In one embodiment, a third map of third optimal focus depths can be generated along the first scan paths after leveling of the substrate 9. A fourth map of fourth optimal focus depths can be generated along the second scan paths after leveling the substrate 9. An additional leveling the substrate 9 with respect to the optics system 900 can be generated employing a weighted average of the third map of first optimal focus depths and the fourth map of second optimal focus depths.

A total range of deviations of the first optimal focus depths ofd1 for the semiconductor dies 600 is reduced by leveling the substrate 9. A total range of deviations of the second optimal focus depths ofd2 for the semiconductor dies 600 is reduced by the leveling the substrate 9.

In one embodiment, the semiconductor dies 600 can be in-process semiconductor dies including at least one memory array region 110 and at least one contact region 210 of a three-dimensional memory device. The first image regions 100 comprise areas of instances of the at least one memory array region 110 in the in-process semiconductor dies. The second image regions 200 comprise areas of instances of the at least one contact region 210.

In one embodiment, the second image region 200 comprises a pattern of stepped surfaces of material layers (32, 46) (e.g., including word lines 46) that continuously extend into an area of the first image region 100. In one embodiment, the first image region 100 comprises a pattern of memory stack structures 55 located within a memory array region 110 of a respective semiconductor die 600 and arranged as a two-dimensional array within the at least one memory array region 110. In one embodiment, the path 802 that extends over the first image region 100 (e.g., over a memory plane) also extends over the third image region 300 which comprises a pattern of peripheral devices 700 located within a peripheral device region 220 of the respective semiconductor die 600 and laterally offset from the memory array region 110 along the first horizontal direction.

In one embodiment, the second image regions 200 have a narrower width along the second horizontal direction (such as the y-direction) than the first image regions 100. In one embodiment, a width of each in-process semiconductor die 600 along the second horizontal direction is substantially the same as a sum of a width of the first image region 100 along the second horizontal direction and a width of the second image region 200 along the second horizontal direction.

In one embodiment, each semiconductor die 600 comprises an additional first image region 100 having a same image as, or having a mirror image of, the first image region 100. The first scan paths extend over the additional first image regions 100 (and optionally over additional third image regions 300) of the semiconductor dies 600 on the semiconductor substrate 6 along the first horizontal direction.

According to another aspect of the present disclosure, a method of operating a lithographic exposure tool 902 comprises forming semiconductor dies 600 arranged in a plurality of rows and columns in an array on a substrate (9, 1000), wherein the array has a first periodicity along a first horizontal direction (e.g., x-direction or bit line direction) and a second periodicity along a second horizontal direction (e.g., y-direction or word line direction) within a horizontal plane that is parallel to a top surface of the substrate.

Each semiconductor die includes 600 a first image region 100 comprising a NAND memory plane, at least one second image region 2000 comprising a NAND word line contact region 210 which comprises a pattern of stepped surfaces of word lines 46 that continuously extend into an area of the first image region 100 (e.g., into the memory plane) along the second horizontal direction, and a third image region 300 which comprises sense amplifier circuitry 700 in a peripheral device region 220 that is electrically connected to bit lines 98 that laterally extend into the area of the first image region 100 (e.g., into the memory plane) along the first horizontal direction.

The method further comprises applying a photoresist layer 820 over the semiconductor dies 600, loading the substrate (9, 1000) on a stage 6 in the lithographic exposure tool 902, generating a first map of first optimal focus distances along first scan paths 802 (shown in FIGS. 4A and 6) that extend along the first horizontal direction and over the first and the third image regions (100, 300) of the semiconductor dies 600 on the substrate. The first scan paths 802 do not cross any of the second image regions 200 of the semiconductor dies 600.

The method also includes generating a second map of second optimal focus distances along second scan paths {803, (803, 804)} that extend along the first horizontal direction and over the second image regions 200 of the semiconductor dies 600 on the substrate (9, 1000), as shown in FIGS. 4A and 6. The second scan paths {803, (803, 804)} do not cross any of the first and third image regions (100, 300) of the semiconductor dies 600. The method also includes leveling the substrate (9, 1000) with respect to an optics system 900 of the lithographic exposure tool 902.

Figure 4B:
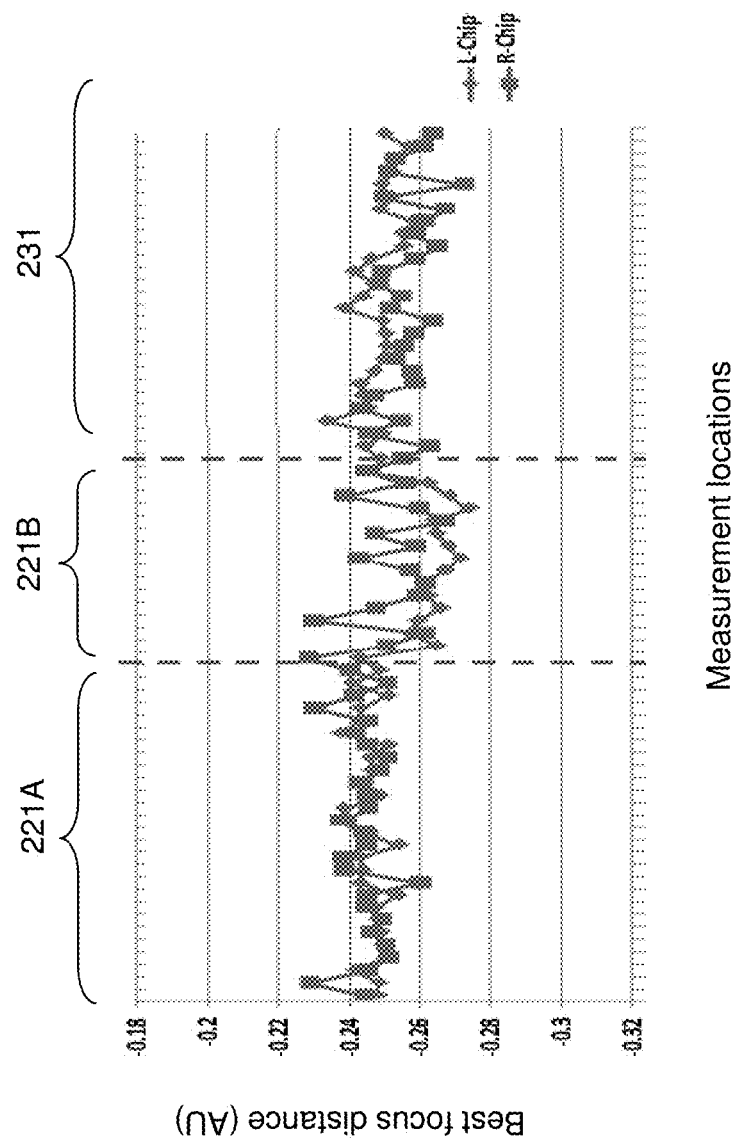
FIG. 4B illustrates exemplary measurement data for best focus distances obtained employing the exemplary scan scheme of FIG. 4A.

In one embodiment shown in FIG. 4A, each semiconductor die 600 comprises at least two memory planes (e.g., first image regions 100) that are offset from each other in the second horizontal direction. The at least one second image region 200 in each of the semiconductor dies comprises 600 an inner second image region 200A located between the two memory planes, and at least one outer second image region 200B located outside of the two memory planes. As shown in FIG. 4B, the step of generating the second map comprises generating a first part of the second map along a first set of second scan paths 803 that extend along the first horizontal direction and over the inner second image regions 200A, and generating a second part of the second map along a second set of second scan paths 804 that extend along the first horizontal direction and over the outer second image regions 200B.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A method of operating a lithographic exposure tool, comprising:
    forming semiconductor dies arranged in a plurality of rows and columns in an array on a substrate, wherein the array has a first periodicity along a first horizontal direction and a second periodicity along a second horizontal direction within a horizontal plane that is parallel to a top surface of the substrate, and each semiconductor die includes a first image region and a second image region having a different pattern of structural components than the first image region;
    applying a photoresist layer over the semiconductor dies;
    loading the substrate on a stage in the lithographic exposure tool;
    generating a first map of first optimal focus distances along first scan paths that extend along the first horizontal direction and over the first image regions of the semiconductor dies on the substrate, wherein the first scan paths do not cross any of the second image regions of the semiconductor dies;
    generating a second map of second optimal focus distances along second scan paths that extend along the first horizontal direction and over the second image regions of the semiconductor dies on the substrate, wherein the second scan paths do not cross any of the first image regions of the semiconductor dies; and
    leveling the substrate with respect to an optics system of the lithographic exposure tool.

2. The method of claim 1, wherein leveling the substrate with respect to the optics system of the lithographic exposure tool comprises employing a weighted average of the first map of first optimal focus distances and the second map of second optimal focus distances, and the method further comprises:'
    determining a first two-dimensional plane that provides a least root mean square distance deviation for the first map of first optimal focus distances; and
    determining a second two-dimensional plane that provides a least root mean square distance deviation for the second map of second optimal focus distances, wherein the leveling of the substrate is performed employing the location of the first two-dimensional plane and the second two-dimensional plane with respect to the optics system.

3. The method of claim 2, further comprising determining a weighted two-dimensional plane within respective to the optics system by calculating a weighted average of the first two-dimensional plane and the second two-dimensional plane,
  wherein leveling the substrate is performed to place a target focal plane within the photoresist layer on the substrate entirely within the weighted two-dimensional plane.

4. The method of claim 3, wherein the target focal plane within the photoresist layer is a two-dimensional plane that is parallel to a top surface of the photoresist layer and located between a bottom surface of the photoresist layer and the top surface of the photoresist layer, at the bottom surface of the photoresist layer, or at the top surface of the photoresist layer.

5. The method of claim 4, further comprising lithographically exposing the semiconductor dies after leveling the substrate with a via pattern,
  wherein:
    more via patterns are formed in the second image region of each semiconductor die than in the first image region of each semiconductor die;
    a first weighting factor multiplied to the first two-dimensional plane for calculation of the weighted two-dimensional plane is less than a second weighting factor multiplied to the second two-dimensional plane for calculation of the weighted two-dimensional plane; and
    the first weighting factor and the second weighting factor are positive and add up to 1.0.

6. The method of claim 3, wherein weighting factors multiplied to the first or second two-dimensional plane for calculation of the weighted two-dimensional plane are not proportional to a respective fraction of scanned areas in the first scan paths or the second scan paths with respect to total scanned areas of the semiconductor dies.

7. The method of claim 2, further comprising:
  determining an x-direction tilt angle and a y-axis tilt angle for the first two-dimensional plane; and
  determining an x-direction tilt angle and a y-axis tilt angle for the second two-dimensional plane, wherein the leveling of the substrate is performed employing the x-direction tilt angles and the y-direction tilt angles.

8. The method of claim 7, further comprising:
  determining a weighted x-direction tilt angle within respective to the optics system by calculating a weighted average of the x-direction tilt angle of the first two-dimensional plane and the x-direction tilt angle of the second two-dimensional plane; and
  determining a weighted y-direction tilt angle within respective to the optics system by calculating a weighted average of the y-direction tilt angle of the first two-dimensional plane and the y-direction tilt angle of the second two-dimensional plane,
  wherein leveling the substrate is performed by tilting the substrate with the weighted x-direction tilt angle within a vertical plane including the x-direction and with the weighted y-direction tilt angle within a vertical plane including the y-direction.

9. The method of claim 8, wherein weighting factors multiplied to the x-direction tilt angle and the y-direction tilt angle of the first or second two-dimensional planes are not proportional to a respective fraction of scanned areas in the first scan paths or the second scan paths with respect to total scanned areas of the semiconductor dies.

10. The method of claim 9, further comprising lithographically exposing the semiconductor dies after leveling the substrate with a via pattern, wherein:
  more via patterns are formed in the second image region of each semiconductor die than in the first image region of each semiconductor die;
  a first weighting factor multiplied to the x-direction tilt angle and the y-direction tilt angle of the first two-dimensional plane is less than a second weighting factor multiplied to the x-direction tilt angle and the y-direction tilt angle of the second two-dimensional plane; and
  the first weighting factor and the second weighting factor are positive and add up to 1.0.

11. The method of claim 8, further comprising:
generating a third map of third optimal focus distances along the first scan paths after leveling of the substrate;
generating a fourth map of fourth optimal focus distances along the second scan paths after leveling the substrate; and
providing an additional leveling the substrate with respect to the optics system employing a weighted average of the third map of first optimal focus distances and the fourth map of second optimal focus distances.

12. The method of claim 1, wherein:
a total range of deviations of the first optimal focus distances for the semiconductor dies is reduced by leveling the substrate; and
a total range of deviations of the second optimal focus distances for the semiconductor dies is reduced by the leveling the substrate.

13. The method of claim 1, wherein:
the substrate comprises a semiconductor wafer;
the semiconductor dies are in-process semiconductor dies including at least one memory array region and at least one contact region of a three-dimensional memory device;
the first image regions comprise areas of instances of the at least one memory array region in the in-process semiconductor dies; and
the second image regions comprise areas of instances of the at least one contact region.

14. The method of claim 13, wherein the second image region comprises a pattern of stepped surfaces of word lines that continuously extend into an area of the first image region.

15. The method of claim 13, wherein:
the first image region comprises a memory plane comprising pattern of memory stack structures located within a memory array region of a respective semiconductor die and arranged as a two-dimensional array within the at least one memory array region; and
the first scan paths extend over the first image region and a third image region which comprises a pattern of sense amplifier peripheral devices located within a peripheral device region of the respective semiconductor die and laterally offset from the memory array region along the first horizontal direction.

16. The method of claim 1, wherein the second image regions have a narrower width along the second horizontal direction than the first image regions.

17. The method of claim 1, wherein each semiconductor die comprises an additional first image region having a same image as, or having a mirror image of, the first image region, and the first scan paths extend over the additional first image regions of the semiconductor dies on the substrate along the first horizontal direction.

18. The method of claim 1, wherein the lithographic exposure tool is a deep ultraviolet lithographic exposure tool, a mid-ultraviolet lithographic exposure tool, or an X-ray lithographic exposure tool.

19. A method of operating a lithographic exposure tool, comprising:

forming semiconductor dies arranged in a plurality of rows and columns in an array on a substrate, wherein the array has a first periodicity along a first horizontal direction and a second periodicity along a second horizontal direction within a horizontal plane that is parallel to a top surface of the substrate, and each semiconductor die includes a first image region comprising a NAND memory plane, at least one second image region comprising a NAND word line contact region which comprises a pattern of stepped surfaces of word lines that continuously extend into an area of the first image region along the second horizontal direction, and a third image region which comprises sense amplifier circuitry in a peripheral device region that is electrically connected to bit lines that laterally extend into the area of the first image region along the first horizontal direction applying a photoresist layer over the semiconductor dies;

loading the substrate on a stage in the lithographic exposure tool;

generating a first map of first optimal focus distances along first scan paths that extend along the first horizontal direction and over the first and the third image regions of the semiconductor dies on the substrate, wherein the first scan paths do not cross any of the second image regions of the semiconductor dies;

generating a second map of second optimal focus distances along second scan paths that extend along the first horizontal direction and over the second image regions of the semiconductor dies on the substrate, wherein the second scan paths do not cross any of the first and third image regions of the semiconductor dies; and leveling the substrate with respect to an optics system of the lithographic exposure tool.

20. The method of claim 19, wherein each semiconductor die comprises at least two memory planes that are offset from each other in the second horizontal direction;

the at least one second image region in each of the semiconductor dies comprises an inner second image region located between the two memory planes, and at least one outer second image region located outside of the two memory planes; and generating the second map comprises generating a first part of the second map along a first set of second scan paths that extend along the first horizontal direction and over the inner second image regions, and generating a second part of the second map along a second set of second scan paths that extend along the first horizontal direction and over the outer second image regions.

* * * * *